(12) United States Patent
Tan

(10) Patent No.: US 8,565,025 B2
(45) Date of Patent: Oct. 22, 2013

(54) DYNAMIC PROGRAMMING FOR FLASH MEMORY

(75) Inventor: Ning Tan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 259 days.

(21) Appl. No.: 13/093,154

(22) Filed: Apr. 25, 2011

(65) Prior Publication Data

US 2012/0268999 A1    Oct. 25, 2012

(51) Int. Cl.
*G11C 16/04* (2006.01)
(52) U.S. Cl.
USPC .................................. 365/185.28; 365/185.19
(58) Field of Classification Search
USPC ........................................ 365/185.28, 185.19
See application file for complete search history.

(56) References Cited

U.S. PATENT DOCUMENTS

| | | | |
|---|---|---|---|
| 6,205,055 B1 | 3/2001 | Parker | |
| 6,301,151 B1 | 10/2001 | Engh et al. | |
| 7,177,199 B2 | 2/2007 | Chen et al. | |
| 7,349,263 B2 | 3/2008 | Kim et al. | |
| 7,408,804 B2 * | 8/2008 | Hemink et al. | 365/185.14 |
| 2007/0274116 A1 | 11/2007 | Choy et al. | |

* cited by examiner

*Primary Examiner* — Jason Lappas
(74) *Attorney, Agent, or Firm* — Mary Jo Bertani; James L. Clingan, Jr.

(57) ABSTRACT

A method is for operating a memory having a group of non-volatile memory cells. A first programming pulse is applied to a subset of the group of non-volatile memory cells. The subset needs additional programming. A portion of the subset still needing additional programming is identified. A ratio of the number of memory cells in the subset and the number of memory cells in the portion is determined. A size of a second programming pulse based on the ratio is selected. The second programming pulse is applied to the portion.

14 Claims, 2 Drawing Sheets

DYNAMIC PROGRAMMING FOR FLASH MEMORY

BACKGROUND

1. Field

This disclosure relates generally to non-volatile memory devices, and more specifically, to dynamic programming for flash memory.

2. Related Art

Semiconductor memory devices are used in a wide variety of electronic devices such as portable telephones, digital cameras, mobile and stationary computing devices, automobiles, appliances, and other devices. Non-volatile memory is a type of electronic memory that can be rewritten and hold data without power. One kind of non-volatile memory cell is consist of floating gate structure that is configured adjacent an insulated channel region in a semiconductor substrate. The channel region is positioned between source and drain regions. A control gate is provided over an insulated region above the floating gate. The threshold voltage of the memory is controlled by the amount of charges that retained on the floating gate. That is, the amount of charges in the floating gate determines the minimum voltage that must be applied on the control gate before the memory cell channel conducts between the source and drain regions. The memory cells can be programmed and erased between two states. Although the threshold voltage of each state is in theory the same for all memory cells, the reality is that some memory cells are programmed or erased faster than others, resulting in a distribution of threshold voltage for each state. Because of this, it is desired to adjust the width of the threshold voltage distribution as tight as possible to allow more read margin and less leakage current, which unfortunately, is a time consuming process. Additionally, it is quite common that the time spent adjusting the distribution width depends on the number of refresh cycles the memory cells have been experienced, the operating temperature of the memory device, and the process used to manufacture the memory cells.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
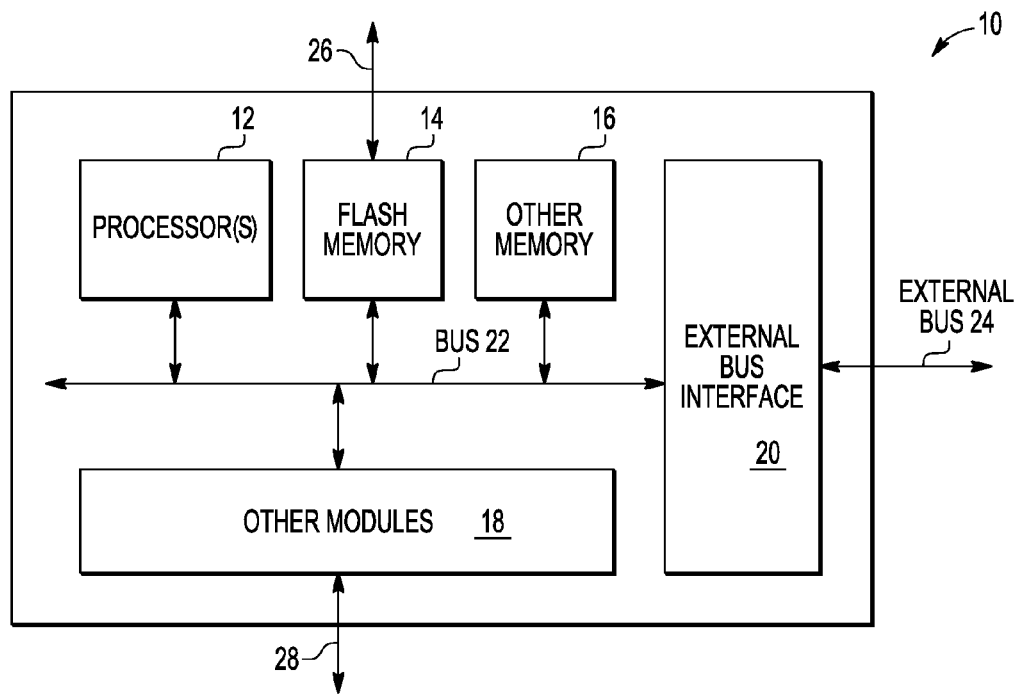
FIG. 1 illustrates a block diagram of an embodiment of an integrated circuit in accordance with the present invention.

FIG. 1 illustrates a block diagram of an embodiment of an integrated circuit 10 in accordance with the present invention. Integrated circuit (IC) 10 can include one or more processors 12, one or more flash memories 14, one or more other memories 16, one or more other modules 18, and an external bus interface 20 which may be bi-directionally coupled by way of bus 22. External bus interface 20 can be coupled to an external bus 24 which may be used to communicate information to and from IC 10. Flash memory 14 can be coupled to one or more integrated circuit terminals 26 which may be used to communicate information between flash memory 16 and circuitry (not shown) that is external to IC 10. In alternate embodiments, computer processor(s) 12, other memory(s) 16, and other module(s) 18 may have one or more integrated circuit terminals (not shown) which may be used to communicate information to and/or from circuitry (not shown) that is external to IC 10. Note that in some embodiments, IC 10 may have only one or more than one flash memories 14.

Flash memory 14 includes an array of memory cells that may be programmed to store information. A programming cycle can include applying a programming voltage, an erase voltage, compaction, and a soft program voltage, as required. Soft programming is used to ensure all the erased memory cells are within a specific voltage range to prevent background leakage current from depleting analog supplies of power. Once the analog supplies are depleted, the memory cells can no longer receive sufficient voltage supplies to be programmed within predefined specifications.

The memory cells need to meet specified threshold voltages to be recognized as programmed or soft programmed. The programming voltage applied to the memory cell is typically applied as a series of pulses. The magnitude of the pulses can be increased with each successive pulse by a predetermined amount until all the memory cells are programmed. In between pulses, verification is carried out to determine whether the threshold of each memory cell is at or above the predefined threshold level. Programming voltage is iteratively increased and applied to memory cells that have not met the threshold voltage until all of the memory cells meet the threshold voltage. The amount of time that is required to program or soft program the memory cells is proportional to the number of pulses required to achieve the threshold voltage. Instead of increasing the programming pulses by a fixed increment, flash memory 14 includes a dynamic method further described herein for determining an increment to increase one or more of the programming voltages based on the number of memory cells that remain unprogrammed between two adjacent program pulses. Dynamically adjusting the pulses of the programming voltage decreases the amount of time required to program or soft program all of the memory cells while automatically reducing dependence on s the number of programming cycles, operating temperature, and manufacturing process variations of the memory cells.

Figure 2:
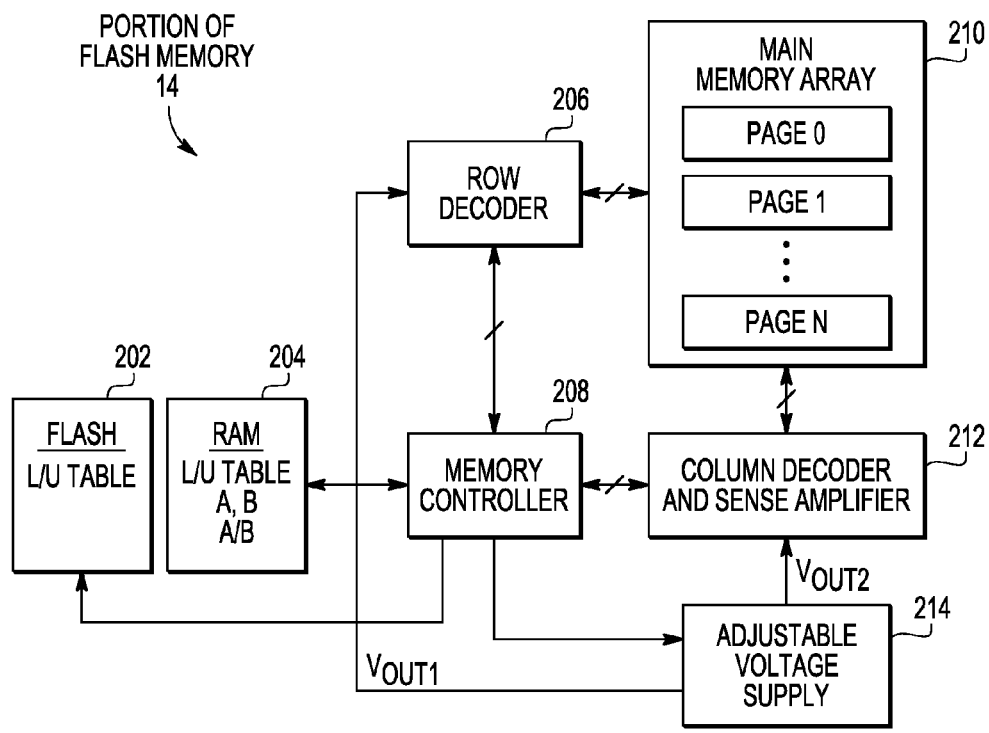
FIG. 2 illustrates a block diagram of components that can be included in flash memory 14 of FIG. 1 in accordance with the present invention.

FIG. 2 illustrates a block diagram of an embodiment of components that can be included in flash memory 14 of FIG. 1 including flash memory 202, random access memory (RAM) 204, row decoder 206, memory controller 208, main memory array 210, column decoder 212, and adjustable voltage supply 214. Main memory 210 can be organized in pages, with each page including a specified number of memory cells. Programming and soft programming operations are typically carried out on a page by page basis while the erase operation is typically performed on the entire memory array 210. The pages are not necessarily composed of a contiguous number of memory cells, so row decoder 206 and column decoder 212 can map specific pages to corresponding memory cells in memory array 210 via respective wordlines and bitlines.

Adjustable voltage supply circuit 214 may be used to provide a first adjustable voltage (Vout1) to row decoder 206 in order to facilitate measurement of the threshold voltages (Vt) of the memory cells in array 210. Row decoder 206 receives Vout1 from adjustable voltage supply 214 and a control signal from memory controller 208. Row decoder 206 uses the control signal to determine whether or not to select one row or wordline in memory array 210. Once a wordline is selected, memory controller 208 provides a plurality of column select signals to column decoder and sense amplifier circuit 212 in order to select the desired column(s). Once the desired row(s) and column(s) are selected, current from the desired memory cells in memory array 210 is available at the inputs to sense amplifiers in circuit 212. The sense amplifiers in circuit 212 convert the received current to data values that can be read as the values stored in the selected memory cells.

Adjustable voltage supply circuit 214 may also be used to provide an adjustable voltage Vout2 to column decoder and sense amplifier circuit 212. Column decoder and sense amplifier circuit 212 receives a control signal from memory controller 208 and uses the control signal to determine whether or not to provide the adjustable voltage Vout2 to memory cells in memory array 210.

Memory controller 308 directs adjustable voltage supply circuit 214 to apply a programming pulse to a first subset of the memory cells that need programming to reach the threshold voltage. After the programming pulse is applied, memory controller 308 identifies a second subset of memory cells that need an additional programming pulse and calculates the ratio of the number of memory cells in the first subset to the number of memory cells in the second subset. A second programming pulse is determined based on the ratio, and adjustable voltage supply 214 applies the second programming pulse to the second subset of memory cells. Additional programming pulses can be determined and applied in this manner until all memory cells reach the threshold voltage.

A portion of flash memory 202 can be used to store data, such as a lookup table or equation (s) and coefficients, for determining characteristics of the programming pulse(s), such as magnitude and/or duration. The data from flash memory 202 can be copied into random access memory (RAM) 204 upon request by memory controller 208 when determining the additional programming pulse(s). RAM 204 can also store temporary information such as the number of unprogrammed memory cells in the first and second subset, as well as the ratio of the first and second subsets of unprogrammed memory cells.

Figure 3:
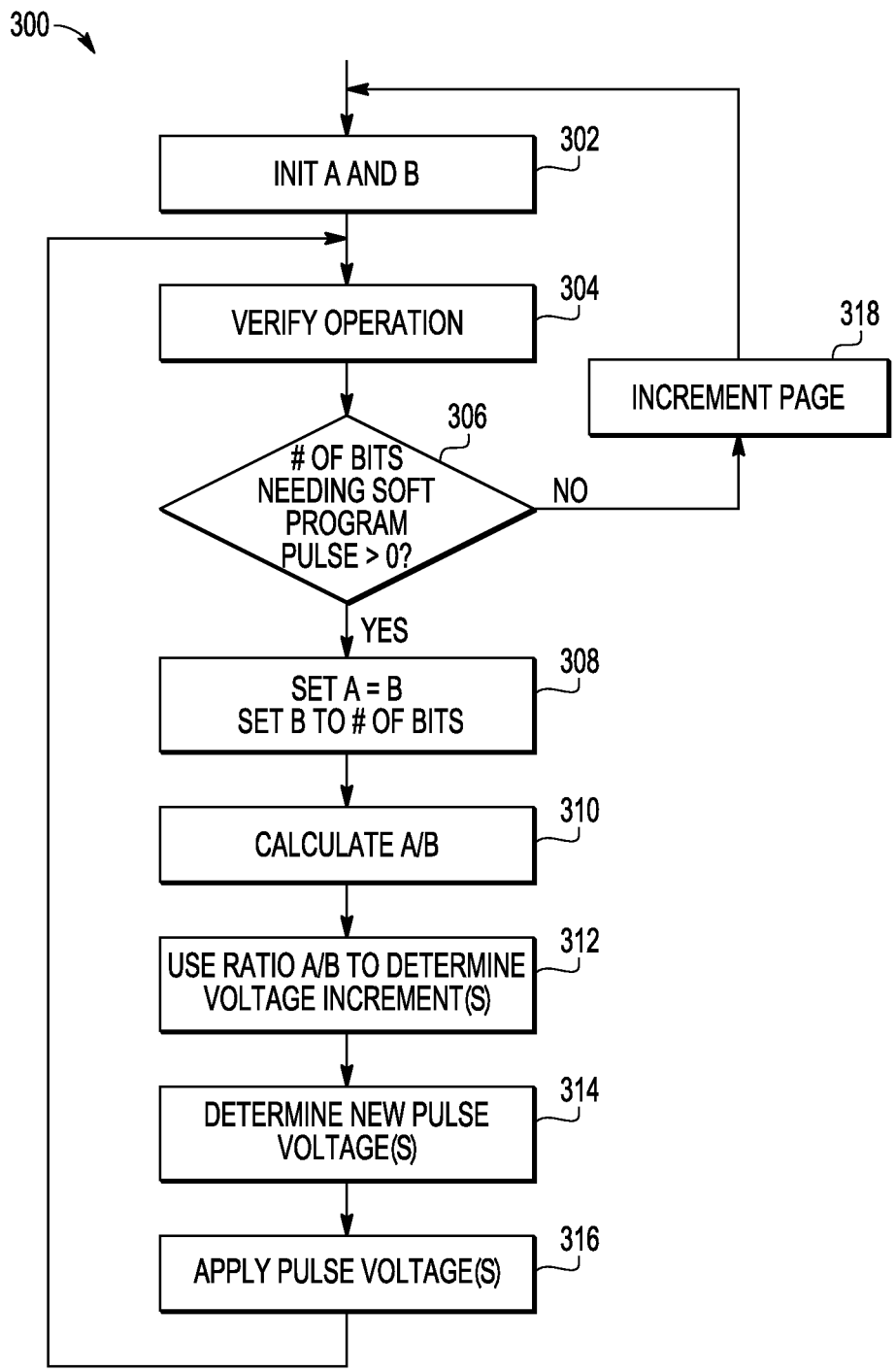
FIG. 3 illustrates a flow diagram of an embodiment of a method in accordance with the present invention.

FIG. 3 illustrates a flow diagram of an embodiment of a method 300 in accordance with the present invention. The values for Vout1 and Vout2 shown in FIG. 2 can be varied according to method 300 to determine additional pulse(s) voltage to apply to memory cells that are more slowly programmed than other memory cells that have achieved a threshold voltage.

Process 302 includes initializing first and second values (denoted as A and B). The values can be set to a number equivalent to or greater than the number of memory cells in a page of the memory array. For example, for pages having 128 memory cells, a 128 bit initialization for Value A and Value B could be 255 or "FF" in hex format. Other suitable techniques for initializing Values A and B can be used.

Process 304 include performing verify operations, for example, program verify and soft program verify operations that determine which memory cells have not achieved a desired threshold voltage. Information regarding the overall number of memory cells and the address of these memory cells that need additional program operation will be available after the verify operation.

Process 306 checks whether the number of memory cells that require an additional programming pulse is greater than zero. If so, process 308 sets Value A to Value B, and Value B is set to the number of memory cells that require an additional programming pulse.

Process 310 calculates the ratio of Value A to Value B. Since the ratio of Value A to Value B will not be less than one, an additional programming pulse is required.

Process 312 uses the ratio of Value A to Value B to dynamically determine one or more voltage increments. Note that voltage increments can be determined for gate voltages, drain voltages or a combination of gate and drain voltages to be applied to the memory cells. In some implementations, the voltage increments may be selected using one or more tables that provide a recommended voltage increment based on the ratio of Value A to Value B. In other implementations, one or more equations can be used to determine the voltage increment proportional to the ratio of Value A to Value B. Other suitable techniques can be used to determine the voltage increment(s) in process 312.

Process 314 determines one or more new pulse voltages to use by incrementing the previous pulse voltage(s) by the incremental pulse voltage(s) determined in process 312. Typically, the incremental pulse voltage(s) are added to corresponding previous pulse voltage(s), however, the increment(s) may be implemented as one or more multipliers that are applied to corresponding previous pulse voltages.

Process 316 includes applying the new pulse voltage(s) to the memory cells that require additional voltage pulses to reach the threshold voltage.

Process 316 returns to process 304 for the next cycle of determining whether additional pulses are required.

Returning to process 306, if the number of bits requiring an additional programming pulse is zero, process 318 increments to the next desired page of memory cells and returns to process 302 for programming memory cells in the corresponding page. Processes 302-318 are repeated for each page of memory cells.

The amount of time required to perform process 300 is generally less than the amount of time required for analog signals to recover between verify operations and programming operations. For example, an analog supply may require 5 microseconds to recover between a verify operation and a programming operation, which is sufficient time for process 300 to be performed.

By now it should be appreciated that there has been provided a method of operating a memory having a group of non-volatile memory cells, comprising applying a first programming pulse to a subset of the group of non-volatile memory cells, wherein the subset needs additional programming. A portion of the subset still needing additional programming is identified. A ratio of the number of memory cells in the subset and the number of memory cells in the portion are determined. A size of a second programming pulse based on the ratio is determined and the second programming pulse is applied to the portion.

In another aspect, the difference between the portion and the subset is a number of non-volatile memory cells that became sufficiently programmed during the applying of the first programming pulse.

In another aspect, the non-volatile memory cells that became sufficiently programmed during the applying of the first programming pulse became sufficiently soft programmed.

In another aspect, the non-volatile memory cells that became sufficiently programmed during the applying of the first programming pulse became sufficiently programmed to be distinguishable from non-volatile memory cells that were in an erased condition.

In another aspect, the selecting the size comprises using the ratio to find the size of the second programming pulse in a look-up table.

In another aspect, the size of the second programming pulse is greater than that of the first programming pulse.

In another aspect, the size of the second programming pulse is greater by having a greater voltage.

In another aspect, the size of the second programming pulse is greater by having a greater duration.

In another aspect, the method further comprises identifying a subportion of the portion still needing additional programming, determining a ratio of the number of non-volatile memory cells in the subportion and the number of memory cells in the portion, selecting a size of a third programming pulse based on the ratio of the number of memory cells in the portion and the number of non-volatile memory cells in the subportion, and applying the third programming pulse to the subportion.

In another aspect, the size of the third programming pulse is greater than that of the second programming pulse.

In another aspect, the ratio of the number of memory cells in the subportion and the number of memory cells in the portion is the number of memory cells in the subportion divided by the number of non-volatile memory cells in the portion.

In another aspect, the ratio of the number of memory cells in the subportion and the number of memory cells in the portion is the number of non-volatile memory cells in the portion divided by the number of non-volatile memory cells in the subportion.

In another aspect, the method further comprises determining if the applying the third programming pulse to the subportion resulted in all of the non-volatile memories in the subportion being sufficiently programmed.

In another aspect, the method further comprises identifying a subset of the subportion still needing additional programming; determining a ratio of the number of non-volatile memory cells in the subset and the number of memory cells in the subportion; selecting a size of a fourth programming pulse based on the ratio of the number of memory cells in the subset and the number of memory cells in the subportion; and applying the fourth programming pulse to the subset.

In another embodiment, a method of performing soft programming on a plurality of non-volatile memory cells that need additional soft programming in order to be in a soft programmed state comprises applying a first soft programming pulse to the plurality of non-volatile memory cells. Non-volatile memory cells of the plurality of non-volatile memory cells that need additional soft programming are identified. A ratio based on the number of non-volatile memory cells receiving the first soft programming pulse and the number of non-volatile memory cells still needing additional soft programming is found. Additional soft programming pulses are applied until all of the non-volatile memory cells of the plurality of memory cells have been soft programmed. Each additional soft programming pulse of the additional soft programming pulses has a size selected based on a ratio of the number of non-volatile memory cells to which an immediately previous additional software programming pulse was applied and the number of non-volatile memory cells still needing soft programming immediately after the immediately previous additional soft programming pulse was applied.

In another aspect, a look-up table is used to determine the sizes of the additional soft programming pulses based on the ratio.

In another aspect, the sizes vary in at least one of voltage magnitude and duration.

In another embodiment, a memory system comprises a memory array including a plurality of non-volatile memory cells that are functional for reading when in a programmed state or in an erased state and an adjustable voltage supply coupled to the memory array. A memory controller directs the adjustable voltage supply to apply a first programming pulse to a subset of the plurality of non-volatile memory cells when the subset needs additional programming, identify a portion of the subset still needing additional programming, determine a ratio of the number of memory cells in the subset and the number of memory cells in the portion, select a voltage of a second programming pulse based on the ratio, and direct the adjustable voltage supply to apply the second programming pulse to the portion.

In another aspect, the array comprises a plurality of pages, wherein the plurality of non-volatile memory cells is a page of the plurality of pages.

In another aspect, a look-up table provides voltage magnitude information for programming pulses based on ratios provided by the memory controller to the look-up table.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 14, 16 may be located on a same integrated circuit or on a separate integrated circuit or located within another peripheral or slave discretely separate from other elements of system 10. Other modules 18 may also be located on separate integrated circuits or devices. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a memory having a group of non-volatile memory cells, comprising:
    applying a first programming pulse to a subset of the group of non-volatile memory cells, wherein the subset needs additional programming;
    identifying a portion of the subset still needing additional programming;
    determining a ratio of the number of memory cells in the subset and the number of memory cells in the portion;
    selecting a size of a second programming pulse based on the ratio; and
    applying the second programming pulse to the portion.

2. The method of claim 1, wherein a difference between the portion and the subset is a number of non-volatile memory cells that became sufficiently programmed during the applying of the first programming pulse.

3. The method of claim 2, wherein the non-volatile memory cells that became sufficiently programmed during the applying of the first programming pulse became sufficiently soft programmed.

4. The method of claim 2, wherein the non-volatile memory cells that became sufficiently programmed during the applying of the first programming pulse became sufficiently programmed to be distinguishable from non-volatile memory cells that were in an erased condition.

5. The method of claim 2, wherein the selecting the size comprises using the ratio to find the size of the second programming pulse in a look-up table.

6. The method of claim 5, wherein the size of the second programming pulse is greater than that of the first programming pulse.

7. The method of claim 6, wherein the size of the second programming pulse is greater by having a greater voltage.

8. The method of claim 6, wherein the size of the second programming pulse is greater by having a greater duration.

9. The method of claim 1, further comprising:
    identifying a subportion of the portion still needing additional programming;
    determining a ratio of the number of non-volatile memory cells in the subportion and the number of memory cells in the portion;
    selecting a size of a third programming pulse based on the ratio of the number of memory cells in the portion and the number of non-volatile memory cells in the subportion; and
    applying the third programming pulse to the subportion.

10. The method of claim 9, wherein the size of the third programming pulse is greater than that of the second programming pulse.

11. The method of claim 9, wherein the ratio of the number of memory cells in the subportion and the number of memory cells in the portion is the number of memory cells in the subportion divided by the number of non-volatile memory cells in the portion.

12. The method of claim 9, wherein the ratio of the number of memory cells in the subportion and the number of memory cells in the portion is the number of non-volatile memory cells in the portion divided by the number of non-volatile memory cells in the subportion.

13. The method of claim 9, further comprising determining if the applying the third programming pulse to the subportion resulted in all of the non-volatile memories in the subportion being sufficiently programmed.

14. The method of claim 9, further comprising:
    identifying a subset of the subportion still needing additional programming;
    determining a ratio of the number of non-volatile memory cells in the subset and the number of memory cells in the subportion;
    selecting a size of a fourth programming pulse based on the ratio of the number of memory cells in the subset and the number of memory cells in the subportion; and
    applying the fourth programming pulse to the subset.

* * * * *